United States Patent [19]
Torigoe

[11] Patent Number: 4,964,720
[45] Date of Patent: Oct. 23, 1990

[54] EXPOSURE APPARATUS

[75] Inventor: Makoto Torigoe, Kawasaki, Japan

[73] Assignee: Canon Kabushiki Kaisha, Tokyo, Japan

[21] Appl. No.: 264,078

[22] Filed: Oct. 28, 1988

[30] Foreign Application Priority Data

Oct. 30, 1987 [JP] Japan .................................. 62-276716

[51] Int. Cl.⁵ ............................................. G03B 21/00
[52] U.S. Cl. ................................................... 353/122
[58] Field of Search ................. 353/122, 121, 101, 99, 353/85, 25; 355/52, 53, 55, 56, 67, 77; 372/56

[56] References Cited

U.S. PATENT DOCUMENTS

| | | | |
|---|---|---|---|
| 3,786,366 | 1/1974 | Chimenti et al. | 372/56 X |
| 4,619,508 | 10/1986 | Shibuya et al. | 353/122 |
| 4,773,750 | 9/1988 | Bruning | 353/122 |

FOREIGN PATENT DOCUMENTS

| | | |
|---|---|---|
| 62-188316 | 8/1987 | Japan . |
| 63-114186 | 5/1988 | Japan . |
| 63-114187 | 5/1988 | Japan . |
| WO8600427 | 1/1986 | PCT Int'l Appl. . |

OTHER PUBLICATIONS

Bradley, "Coherent Radiation Generation at Short Wavelengths VUV and XUV Pulses", pp. 9–18, 1978.

Primary Examiner—Harry N. Haroian
Attorney, Agent, or Firm—Fitzpatrick, Cella, Harper & Scinto

[57] ABSTRACT

An exposure apparatus for exposing a wafer to a pattern of a mask is disclosed. The apparatus includes a metal-vapor laser for supplying light and an optical arrangement for directing, through the mask, the light supplied by the laser to the wafer.

18 Claims, 2 Drawing Sheets

EXPOSURE APPARATUS

FIELD OF THE INVENTION AND RELATED ART

This invention relates to an exposure apparatus, and more particularly, to an exposure apparatus having a laser for illuminating a fine circuit pattern of an original, such as a mask, so that the pattern is transferred onto a workpiece, such as a wafer.

Recent trends of higher-degree integration of semiconductor microcircuits has forced further miniaturization of circuit patterns to be transferred onto a wafer. In the field of semiconductor device manufacturing exposure apparatuses, each called a "stepper", use of light of shorter wavelength in place of conventionally used light of g-line ($\lambda=436$ nm) or otherwise, has been considered.

As a light source which can supply light of short wavelength in the deep ultraviolet region, excimer lasers are well known. Many attempts have been and are being made in stepper manufacturers and IC manufacturers to develop an exposure apparatus having an excimer laser as a light source. An example of such exposure apparatus is proposed in PCT International Publication WO 86/00427 in detail.

Laser beams which can be supplied by an excimer laser have a wavelength $\lambda$ which is about 248 nm, for example, when the laser is a KrF excimer laser. Optical glass materials having an appropriate transmission factor with respect to such a light in the deep UV region are limited, and only silica ($SiO_2$) and calcium fluorite ($CaF_2$) are practical examples.

Accordingly, when an excimer laser is used in a projection exposure apparatus as a light source, it will be necessary to form a projection optical system, for projecting a mask pattern upon a wafer, from these limited glass materials. This leads to difficulty in correction of chromatic aberration caused by the projection optical system with respect to a laser beam normally supplied from an excimer laser and having a wavelength range (bandwidth) on an order of 0.4 nm.

In consideration of this, a proposal has been made to extraordinarily narrow the spectral linewidth of a laser beam from an excimer laser by incorporating a wavelength selecting element, such as a grating or etalon, into a laser cavity. The proposal is made in the aforementioned PCT International Publication, for example. By using such a band-narrowed laser beam, the above-described problem of chromatic aberration can be solved.

However, band-narrowing by use of such a wavelength selecting element still involves some inconveniences, such as occurrence of chromatic aberration of a projection optical system and/or a focus change and a magnification change in the projection optical system, due to variation in the wavelength of a laser beam which results from disorder of mechanical stability of the wavelength selecting element, such as a grating, or etalon, or which results from variation in ambience, such as ambient temperature, humidity or otherwise. As a consequence, there is still a possibility of deterioration of the circuit pattern transferring performance.

SUMMARY OF THE INVENTION

It is accordingly a primary object of the present invention to provide a novel and unique exposure apparatus by which the above-described problems can be obviated.

As will be described later, in greater detail, the present invention uses a metal-vapor laser as a laser source means for exposure. This laser can emit a laser beam of very narrow band-width, with substantially no wavelength shift. Therefore, it is easily possible to avoid deterioration in the pattern transfer performance.

In another aspect, the present invention uses a harmonic (beam) producing means so that the light emitted from a laser for the purpose of exposure is directed through this harmonic producing means to a mask. By passing a laser beam through a harmonic producing means, the wavelength of the laser beam can be shortened and, in addition thereto, the bandwidth can be narrowed. As a result, finer patterns can be transferred, exactly onto a wafer. Moreover, substantially no wavelength change occurs.

An exposure apparatus according to one preferred form of the present invention has all the features described above. More specifically, according to this preferred form, there is provided an exposure apparatus for transferring a pattern of a mask onto a wafer, wherein the exposure apparatus includes a metal-vapor laser and a harmonic producin--g means disposed in the path of the laser beam from the laser and wherein, by the harmonic producing means, a light whose wavelength is further shorter than that of the light emitted from the laser can be produced, such a light of very short wavelength being used to illuminate the mask to thereby transfer the mask pattern onto the wafer.

A copper-vapor laser is an example of a metal-vapor laser, suitable to the present invention. A copper-vapor laser can emit a wavelength $\lambda=510$ nm or $\lambda=578$ nm. For example, a laser beam of $\lambda=510$ nm can be transformed by a harmonic producing means into a deep UV laser beam of a wavelength $\lambda=255$ nm which is a second harmonic (beam). A copper-vapor laser can produce a laser beam of a very narrow band range and, additionally, can supply a laser beam of a particular wavelength stably. As a result, superior pattern transfer onto a wafer is assured with certainty, as contrasted to conventional exposure apparatuses using an excimer laser.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
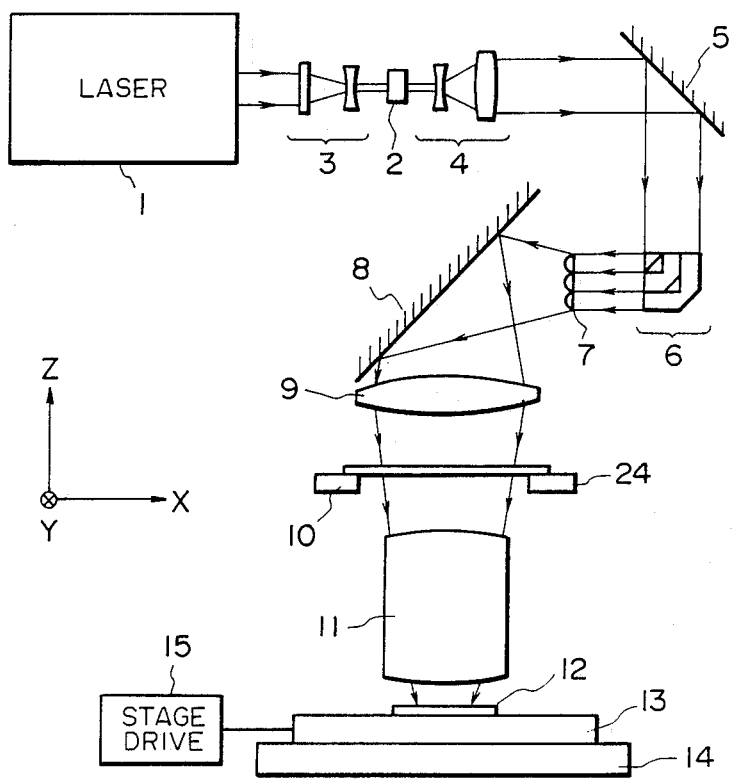
FIG. 1 is a schematic and diagrammatic illustration showing an exposure apparatus according to one embodiment of the present invention.

Referring first to FIG. 1 which is a schematic illustration showing an exposure apparatus according to an embodiment of the present invention, reference numeral 1 denotes a copper-vapor laser which provides a light source having an emission wavelength $\lambda=510$ nm and an output power $W=70$ (W). Reference numeral 2 denotes a harmonic producing element which comprises an electro-optic crystal such as ADP ($NH_4H_2PO_4$), $\beta$-$BaB_2O_4$ or otherwise. The effective diameter of a laser beam which can be modulated by this element is about 10 mm. Reference numeral 3 denotes a beam diameter reducing optical system which is disposed in the path of a laser beam, between the copper-vapor laser 1 and the harmonic producing element 2. The beam diameter reducing optical system is effective to transform a laser beam emitted from the copper-vapor laser 1 and having a beam diameter of about several centimeters, into a parallel laser beam having a beam diameter of about 10 mm. With this arrangement, the laser beam from the copper-vapor laser 1 can be effectively modulated by the harmonic producing element 2.

The harmonic producing element 2 has a function for shortening the wavelength of a laser beam passing therethrough, to 1/n (where n = 2, 3, ... ). Thus, by appropriately setting the direction of the optic axis of the crystal, constituting the harmonic producing element, with respect to the laser beam to thereby determine the order n of the harmonic of the element, light of a desired wavelength can be produced. Regarding details of the structure and the wavelength transformation principle of such a harmonic producing element, reference may be made to printed publications, an example of which is "Laser Handbook", Chapter 7, published by Asakura Shoten, Japan.

Denoted at 4 is a beam expanding optical system which is adapted to enlarge the beam diameter of the short-wavelength parallel laser beam produced by the harmonic producing element 2, to such a size that can be used as an illumination beam. The harmonic producing element 2 used in the present embodiment produces a second harmonic (beam), and the laser beam from the copper-vapor laser 1, having a wavelength $\lambda = 510$ nm, is transformed by this harmonic producing element 2 into a laser beam of a wavelength $\lambda = 255$ nm and, thereafter, its beam diameter is expanded by the beam expanding optical system 4.

The parallel laser beam having an enlarged diameter is directed by way of a deflecting mirror 5, a beam-dividing and incoherence-transformation optical system 6, a fly's-eye lens 7 and another deflecting mirror 8 and through a condenser lens 9, to illuminate a reticle (mask) 10 on which a circuit pattern is formed.

The beam-dividing and incoherence-transformation optical system 6 is arranged to divide a coherent laser beam supplied from the copper-vapor laser 1, and also it is adapted to transform a received light into mutually incoherent lights. By using such an optical system, an adverse effect of unpreferable interference patterns, such as speckle, can be reduced and the reticle 10 can be illuminated with uniform illuminance. For a better understanding of such a beam-dividing and incoherence transformation optical system, as denoted at 6, reference may be made to Japanese Laid-Open Patent Applications, Laid-Open Nos. Sho 63-114186 and Sho 63-114187. Alternatively, an illumination system proposed in U.S. Pat. No. 4,619,508 may be usable, while slight modification may be necessary.

As is well known in the art, the fly's-eye lens 7 functions to form a plurality of secondary light sources. Mutually incoherent laser beams emanating from lens elements of the fly's-eye lens system 7 are directed by way of the deflecting mirror 8 and the condenser lens 9 and are superposed one upon another, on the surface of the reticle 10.

By such superposition of the laser beams by means of the fly's-eye lens system 7, deflecting mirror 8 and condenser lens 9, a uniform illuminance distribution is assured on the surface of reticle 10.

Reticle 10 comprises a base plate of silica ($SiO_2$) on which a circuit pattern is formed by using metal, such as chromium. The reticle 10 is placed on a reticle stage 24.

It is to be noted that all the light-transmissible optical components, such as a lens, disposed in the path of the laser beam, between the copper-vapor laser 1 and the reticle 10, are formed of silica, in this embodiment.

Projection lens system 11 may be formed of a glass material of silica and/or calcium fluorite. In this embodiment, the projection lens system 11 has been designed for use with a wavelength (central wavelength) of 255 nm. Reference numeral 12 denotes a wafer having an upper surface coated with a photoresist material. The circuit pattern of reticle 10, when it is uniformly illuminated by a laser beam, is projected by the projection lens system 11 upon the wafer 12 in a reduced scale, such that fine circuit patterns are printed on different shot areas of the wafer 12.

The wafer 12 is placed on and held by a wafer stage 13 which is disposed on a surface plate 14, for translational movement and rotational movement in an X-Y plane and for vertical movement along an optical axis (in a Z-axis direction) of projection lens system 11. The amount and direction of the movement of the wafer stage 13 are controlled by a driving device 15.

The stage driving device 15 is operable to controllably move the wafer stage 13 so as to bring the position of the wafer 12 surface into coincidence with the focus position of the projection lens system 11, as well as to move the wafer 12 stepwise and in sequence, in the X and Y directions, so that circuit patterns are transferred onto the shot areas on the wafer.

In the present embodiment, a reticle 10 is illuminated by use of a laser beam of a wavelength $\lambda' = 255$ nm which is a second harmonic of a laser beam of a wavelength $\lambda = 510$ nm as supplied by the copper-vapor laser 1 and, by doing so, the circuit pattern of the reticle 10 is transferred onto the wafer 12.

The spectral bandwidth $\Delta \lambda$ of a laser beam supplied by the copper-vapor laser 1 is on an order of 0.006 nm, and the laser beam after passing through the harmonic producing element 2 (whose wavelength $\lambda' \approx 255$ nm) has a spectral bandwidth having been narrowed approximately in half, namely $\Delta \lambda'$ is about 0.003 nm. Accordingly, as described, the projection lens system 11 can be formed of a single glass material using only one of silica and calcium fluorite. Also, there is substantially no necessity of taking into account the correction of chromatic aberration of the projection lens system 11. Even if correction of chromatic aberration, to some degree, is necessary, this can be done by simply arranging lenses of silica and calcium fluorite. It is not necessary to use what is called a "cemented lens". Cemented lenses involve inconveniences with regard to absorption or durability, with respect to deep UV light. Also, in this sense, merits of an exposure apparatus of the present embodiment are effective.

While, in the present embodiment, the second harmonic of the copper-vapor laser 1 is produced by the harmonic producing element 2 and is used, the type of metal-vapor laser and the order (n) of the harmonic are determined in dependence upon the wavelength of the laser beam used as photoprinting light.

More specifically, when the wavelength of harmonic (photoprinting light) is not less than 400 nm, the degree of the effect of wavelength shortening is small as compared with a conventional g-line ($\lambda \approx 436$ nm) and, therefore, such a high resolving power will not be attainable.

On the other hand, when the wavelength is not greater than 200 nm, there arises a problem that laser light begins to be absorbed by air, silica, calcium fluoride or otherwise. In consideration of the above, as a harmonic, one having a wavelength in a range of 200-400 nm may be suitably used and, in accordance with this, as a metal-vapor laser, such a laser as having an emission wavelength longer, by n times, than the wavelength 200-400 nm is suitably selected. The laser beam from such a metal vapor laser is transformed by a harmonic producing element into a harmonic of n-th order, and such a harmonic is used as a photoprinting light.

The following Table shows emission wavelengths and output powers of various metal-vapor lasers including a copper-vapor laser.

TABLE

| METAL | WAVELENGTH (nm) | POWER (W) |
| --- | --- | --- |
| Gold | 312, 628 | 1, 6 |
| Manganese | 534 | 2.5 |
| Copper | 510, 578 | 70 |
| Lead | 723 | 4 |
| Calcium | 854, 866 | 0.7 |
| Barium | 1500 | 12 |
| Strontium | 6450 | 1 |

As described, a harmonic producing element 2 may be formed by an electro-optic crystal such as ADP, $\beta$-BaB$_2$O$_4$ or otherwise. For effective utilization of a laser beam, it is desirable to use such an element as having a higher transformation efficiency. Usually, $\beta$-BaB$_2$O$_4$ shows a transformation efficiency of about 10–40%, and this is one preferred example suitable to the present invention.

Figure 2:
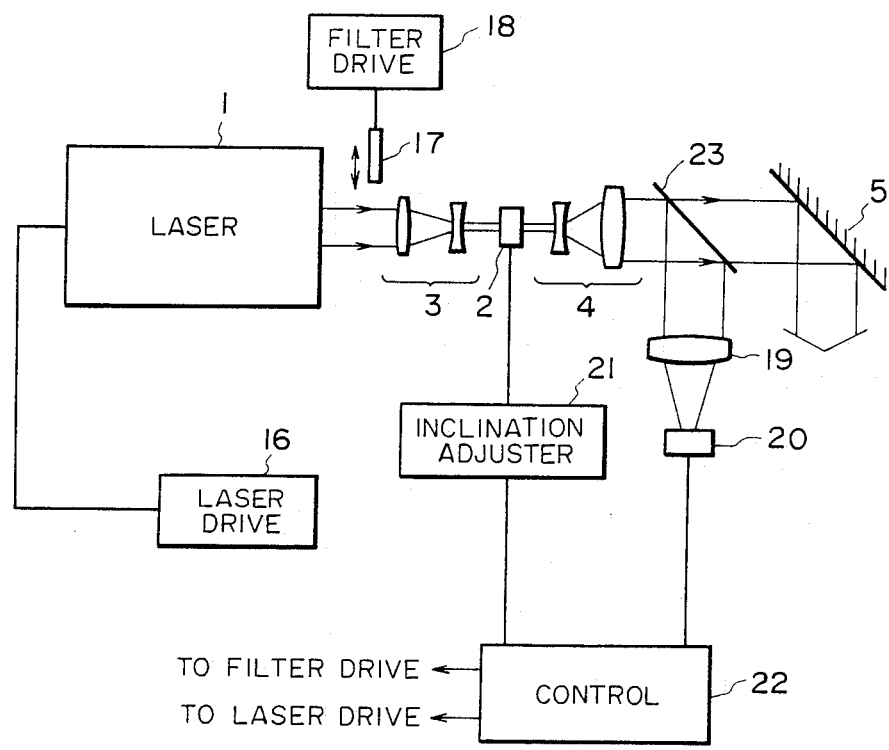
FIG. 2 is a fragmentary view schematically and diagrammatically showing an exposure apparatus according to another embodiment of the present invention.

Referring back to FIG. 1, the harmonic producing element 2 is disposed in the path of the parallel laser beam, between the beam reducing optical system 3 and the beam expanding optical system 4. when the energy density of the laser beam passing through the harmonic producing element 2 is too high, there may occur damage of the element 2. For this reason, when the energy density of the laser beam is higher than the damage threshold of the element 2, it is necessary to control the output power of the copper-vapor laser 1 by use of a laser driver 16 (FIG. 2) to make the energy density lower than this threshold. Alternatively, or in addition thereto, as illustrated in FIG. 2, a suitable means, such as an ND filter 17, which can be selectively introduced into the path between the copper-vapor laser 1 and the harmonic producing element 2 by means of a filter driving device 18, may be used to attenuate the intensity of the laser beam.

Conventional excimer lasers have a repetition frequency of about several hundred Hz and, when the exposure of each shot area on a wafer should be made in a short time period, on an order of 0.1 sec, for improved throughput of the exposure apparatus, each exposure will be made by several tens of pulses. The exposure control at this time must be made precisely to assure superior pattern transfer. Accordingly, assuming that there is unevenness of ± several percentages in intensity among the pulses, the amount of exposure can be controlled more precisely with higher repetition frequency, that is, with a larger number of pulses for each exposure (shot).

Usually, the repetition frequency of a metalvapor laser which can be used in the present invention is several kilohertz which is higher, by ten or more times, than that of an excimer laser. As a result, if the time for each exposure is about 0.1 sec, several hundred pulses of laser beams can be supplied for each shot and, consequently, the amount of exposure can be controlled very precisely.

When use is made of an illumination system, such as disclosed in the aforementioned U.S. Pat. No. 4,619,508, wherein formation of secondary light sources and incoherence transformation are made on the basis of laser beam scanning, use of a larger number of pulses of laser beam is effective to alleviate the effect of speckle.

Accordingly, the present invention is also very effective to such an exposure apparatus having this type of illumination system.

A metal-vapor laser used in the present invention is such a laser in which its emission wavelength is determined only by a difference in energy level between metallic atoms or metallic ions which move at the time of laser oscillation. Therefore, the oscillation wavelength of a laser does not change due to mechanical instability of the laser or due to any change in ambience such as temperature, humidity or otherwise. Consequently, there does not occur focus change or magnification change in the projection optical system and, as a result of which, superior pattern transfer is assured with certainty.

In a metal-vapor laser, there occurs mechanical vibration or heat generation at the time of laser oscillation. In consideration of this, as an example, a laser unit (which includes elements 1, 2, 3, 4 and 5 shown in FIG. 1) and an exposure unit (which includes elements 6, 7, 8, 9, 10, 11, 12, 13 and 14) may be disposed separately so as to prevent transmission of heat generation and vibration in the copper-vapor laser 1 to the exposure unit. Although in this Specification, a separate arrangement comprising a laser unit (1-5) and an exposure unit (6-14) is proposed, the entire exposure system may, of course, be conveniently designed so that it is separated into a laser unit (1-4) and an exposure unit (5-14), for example.

When such a unit structure is adopted to provide a separate arrangement, a suitable laser aligning mechanism or correcting mechanism may be added to prevent shift of the laser beam traveling between separate units.

The transformation efficiency of the harmonic producing element 2 has a large affect on the angle of incidence of the laser beam. In consideration of this, as shown in FIG. 2, an inclination adjusting mechanism 21 may be provided to adjust the inclination of the element 2. Additionally, a suitable monitoring device 20 may be provided to monitor the quantity of laser light of a particular wavelength $\lambda'$. The inclination adjustment may be conveniently made in the following manner: While preventing a laser beam from being directed to a wafer 12 by using a suitable shutter means (not shown), the adjusting mechanism 21 is actuated in accordance with an output signal from the light quantity monitoring device 20, which signal is applied thereto by way of a control device 22. As for such a monitoring device 20, an ordinary exposure monitor device may be used in common. This is preferable for simplification of the structure of the apparatus.

In FIG. 2, reference numeral 23 denotes a beam splitter which is operable to reflect, a portion of a laser beam from a beam expanding optical system 4 to direct the same toward the light quantity monitoring device 20. A large portion of the laser beam as transmitted through the beam splitter 23 advances toward a mirror 5. Reference numeral 19 denotes a condensing lens which functions to focus the laser beam, as reflected by the beam splitter 23, upon a light-receiving surface of the monitoring device 20.

In place of adjusting the inclination of the harmonic producing element 2, the angle of incidence of a laser beam to be projected upon this element may be adjusted. In such a case, it is necessary to re-adjust the inclination of the laser beam so that a central ray of the laser beam passing through the element 2 passes exactly along an optical axis of the beam diameter expanding optical system 4.

In the present embodiment, as an optical system for transferring a circuit pattern of a reticle 10 upon a wafer, a projection lens system 11, which comprises a plurality of lens elements, is used. However, as for such an optical system, a reflection optical system comprising a combination of reflection mirrors, a reflective-refractive optical system (catadioptic system) comprising a combination of one or more refractive optics, such as lenses and one or more reflection mirrors, may, of course, be used.

In accordance with the present invention, as has hitherto been described, a metal-vapor laser is used to transfer a circuit pattern of a mask or reticle onto a wafer. This effectively avoids deterioration of pattern transfer performance due to any change in wavelength, as in a case when an excimer laser is used.

Further, a metal-vapor laser has a high-repetition frequency, which permits use of a very large number of pulses of laser beams for each exposure. As a result, very precise exposure control is attainable. Accordingly, a circuit pattern of a mask or reticle can be transferred onto a wafer, continuously in an optimum state.

Additionally, a laser beam whose wavelength is shortened by a harmonic producing means is directed to a mask and finer patterns can be transferred correctly and exactly, onto a wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a wafer to a pattern of a mask, said apparatus comprising:
   a metal-vapor laser for supplying a laser beam; and
   an optical arrangement for directing, through the mask, the laser beam supplied by said laser to the wafer;
   wherein said optical arrangement comprises a harmonic generator for transforming the laser beam directed to the mask into a harmonic beam and for exposing the wafer to the pattern of the mask and printing the pattern of the mask onto the wafer.

2. An apparatus according to claim 1, wherein said laser comprises a copper-vapor laser and wherein said harmonic generator transforms the laser beam from said copper-vapor laser into a second harmonic beam, the transformed second harmonic beam being directed to the wafer.

3. An apparatus according to claim 1, further comprising monitoring means for monitoring the intensity of the harmonic beam and adjusting means for adjusting the inclination of said harmonic generator in response to an output signal from said monitoring means.

4. An apparatus according to claim 1, wherein said optical arrangement further comprises a projection optical system for projecting, upon the wafer, the pattern of the mask illuminated by the harmonic beam.

5. An apparatus according to claim 4, wherein said projection optical system comprises a single glass material.

6. An apparatus according to claim 1, wherein said optical arrangement further comprises:
   a first lens system for reducing the diameter of the laser beam from said laser and for directing the reduced beam to said harmonic generator;
   a second lens system for enlarging the diameter of the harmonic beam from said harmonic generator; and
   an illumination lens system for illuminating the mask by the harmonic beam enlarged by said second lens system.

7. An apparatus according to claim 6, further comprising means for modulating the intensity of the laser beam directed to said harmonic generator.

8. A projection exposure apparatus, comprising:
   a metal-vapor laser for emitting a laser beam;
   a mask stage for supporting a mask;
   a wafer stage for supporting a wafer;
   illumination means for illuminating the mask with the laser beam emitted from said laser, said illumination means comprising a harmonic generator for transforming the laser beam into a harmonic beam being directed to the mask; and
   a projection lens system for projecting, upon the wafer, a pattern of the mask illuminated by the harmonic beam, for printing the pattern of the mask on the wafer.

9. An apparatus according to claim 8, wherein said laser comprises a copper-vapor laser and wherein said harmonic generator produces a second harmonic beam for being directed to the mask.

10. An apparatus according to claim 9, wherein said laser emits a laser beam having a wavelength of approximately 510 nm.

11. An apparatus according to claim 9, wherein said laser emits a laser beam having a wavelength of approximately 578 nm.

12. An apparatus according to claim 9, wherein said harmonic generator comprises an electrooptic crystal.

13. An apparatus according to claim 12, wherein said crystal comprises $\beta$-BaB$_2$O$_4$.

14. A projection exposure apparatus for the manufacture of semiconductor devices, comprising:
   a copper-vapor laser for emitting a first harmonic laser beam;
   a mask stage for supporting a mask;
   a wafer stage for supporting a wafer;
   illumination means comprising a second harmonic generator for transforming the laser beam emitted from said laser into a second harmonic beam for illuminating the mask; and
   a reduction projection lens system provided between said mask and wafer stages, for projecting a circuit pattern of the mask upon the wafer for printing the circuit pattern of the mask onto the wafer.

15. An exposure method, comprising the steps of:
   emitting a laser beam from a metal-vapor laser;

transforming the laser beam into a harmonic beam; and exposing a workpiece to the harmonic beam for printing a predetermined pattern on the workpiece.

16. A method according to claim 15, wherein said step of emitting a lasser beam comprises emitting the laser beam from a copper-vapor laser.

17. A method according to claim 16, wherein said step of transforming the lasser beam comprises transforming the laser beam into a second harmonic beam.

18. A method according to claim 17, wherein said step of exposing the workpiece to the harmonic beam comprises expanding the harmonic beam, illuminating a predetermined circuit pattern of a mask with the expanded beam and projecting the illuminated circuit pattern of the mask onto the workpiece by a projection lens system.

* * * * *

UNITED STATES PATENT AND TRADEMARK OFFICE
CERTIFICATE OF CORRECTION

PATENT NO. : 4,964,720

DATED : October 23, 1990

INVENTOR(S) : Makoto Torigoe

It is certified that error appears in the above-identified patent and that said Letters Patent is hereby corrected as shown below:

COLUMN 2

Line 6, "band-width, with" should read --bandwidth with--.

COLUMN 5

Line 43, "when" should read --When--.

Signed and Sealed this

Fifth Day of May, 1992

*Attest:*

DOUGLAS B. COMER

*Attesting Officer*  *Acting Commissioner of Patents and Trademarks*